(12) United States Patent
Chen et al.

(10) Patent No.: US 12,122,131 B2
(45) Date of Patent: Oct. 22, 2024

(54) DECORATIVE SHEET AND COVER PLATE FOR CONSUMER ELECTRONIC PRODUCT

(71) Applicant: SHINE OPTOELECTRONICS (KUNSHAN) CO., LTD., Kunshan (CN)

(72) Inventors: Hao Chen, Kunshan (CN); Lidong Liu, Kunshan (CN); Yulong Gao, Kunshan (CN); Guisheng Wang, Kunshan (CN)

(73) Assignee: SHINE OPTOELECTRONICS (KUNSHAN) CO., LTD., Kunshan (CN)

( * ) Notice: Subject to any disclaimer, the term of this patent is extended or adjusted under 35 U.S.C. 154(b) by 510 days.

(21) Appl. No.: 17/320,547

(22) Filed: May 14, 2021

(65) Prior Publication Data

US 2021/0274670 A1    Sep. 2, 2021

Related U.S. Application Data

(63) Continuation of application No. PCT/CN2019/108427, filed on Sep. 27, 2019.

(30) Foreign Application Priority Data

Nov. 16, 2018   (CN) .......................... 201811368005.4

(51) Int. Cl.
*B32B 3/26* (2006.01)
*B05D 5/06* (2006.01)
(Continued)

(52) U.S. Cl.
CPC .................. *B32B 3/26* (2013.01); *B05D 5/06* (2013.01); *B32B 5/142* (2013.01); *B44C 3/02* (2013.01);
(Continued)

(58) Field of Classification Search
None
See application file for complete search history.

(56) References Cited

U.S. PATENT DOCUMENTS

| 4,935,264 A | * | 6/1990 | Tsujino | ............... B32B 17/1077 |
| | | | | 427/163.1 |
| 6,326,074 B1 | * | 12/2001 | Takahashi | .............. D21H 19/66 |
| | | | | 428/206 |

(Continued)

FOREIGN PATENT DOCUMENTS

| CN | 1684843 A | 10/2005 |
| CN | 2741670 Y | * 11/2005 |

(Continued)

OTHER PUBLICATIONS

Machine Translation of CN-207877590-U, Sep. 2018 (Year: 2018).*

(Continued)

*Primary Examiner* — Jeffrey A Vonch
(74) *Attorney, Agent, or Firm* — Westbridge IP LLC

(57) ABSTRACT

The present application discloses a decorative sheet including a supporting layer and a solid film layer. The solid film layer is disposed on the supporting layer and presents a color. The solid film layer includes a single layer or a composite layer. A thickness and/or material of at least one layer in the solid film layer is set to be varied. In this application, through the change of the thickness and/or material of the solid film layer, the color of the solid film layer can be changed, including shade changes, color changes and other variety changes, so that the decorative sheet has rich color, rich vision, better decoration effect and higher recognition. Furthermore, the present application further discloses a cover plate for a consumer electronic product with the above-mentioned decorative sheet.

20 Claims, 5 Drawing Sheets

(51) Int. Cl.
*B32B 5/14* (2006.01)
*B32B 17/06* (2006.01)
*B32B 27/06* (2006.01)
*B32B 33/00* (2006.01)
*B44C 3/02* (2006.01)
*B44F 1/08* (2006.01)
*C23C 28/00* (2006.01)
*H05K 5/02* (2006.01)
*H05K 5/03* (2006.01)
*B32B 3/30* (2006.01)
*B32B 7/023* (2019.01)
*B32B 15/04* (2006.01)
*B44F 1/04* (2006.01)
*C23C 14/00* (2006.01)
*H04M 1/02* (2006.01)

(52) U.S. Cl.
CPC ............... *B44F 1/08* (2013.01); *C23C 28/00* (2013.01); *C23C 28/40* (2013.01); *H05K 5/0243* (2013.01); *H05K 5/03* (2013.01); *B05D 5/065* (2013.01); *B05D 5/066* (2013.01); *B32B 3/30* (2013.01); *B32B 7/023* (2019.01); *B32B 15/04* (2013.01); *B32B 17/06* (2013.01); *B32B 27/06* (2013.01); *B32B 33/00* (2013.01); *B32B 2255/10* (2013.01); *B32B 2255/205* (2013.01); *B32B 2255/28* (2013.01); *B32B 2307/402* (2013.01); *B32B 2307/414* (2013.01); *B32B 2307/416* (2013.01); *B32B 2307/418* (2013.01); *B32B 2451/00* (2013.01); *B32B 2457/00* (2013.01); *B44F 1/04* (2013.01); *C23C 14/0015* (2013.01); *H04M 1/0283* (2013.01); *Y10S 428/9133* (2013.01); *Y10T 428/162* (2015.01); *Y10T 428/164* (2015.01); *Y10T 428/24479* (2015.01); *Y10T 428/24521* (2015.01); *Y10T 428/24537* (2015.01); *Y10T 428/24545* (2015.01); *Y10T 428/24612* (2015.01); *Y10T 428/24802* (2015.01); *Y10T 428/24851* (2015.01); *Y10T 428/24917* (2015.01); *Y10T 428/24942* (2015.01); *Y10T 428/2495* (2015.01)

(56) References Cited

U.S. PATENT DOCUMENTS

| | | | |
|---|---|---|---|
| 2003/0021917 A1* | 1/2003 | Hotaka | B44F 1/14 428/29 |
| 2003/0031842 A1* | 2/2003 | Marietti | B32B 17/10339 428/432 |
| 2007/0026205 A1* | 2/2007 | Anton | C23C 14/0015 428/195.1 |
| 2007/0116933 A1 | 5/2007 | Kobayashi et al. | |
| 2008/0145703 A1* | 6/2008 | Liu | C23C 14/083 428/702 |
| 2009/0080076 A1* | 3/2009 | Fujikura | G02B 5/02 359/585 |
| 2009/0162618 A1* | 6/2009 | Matsui | C23C 14/044 204/192.12 |
| 2009/0235833 A1* | 9/2009 | Shi | G03F 7/038 430/7 |
| 2009/0324908 A1* | 12/2009 | Hsu | B44C 3/10 264/132 |
| 2010/0060987 A1* | 3/2010 | Witzman | G02B 5/285 427/162 |
| 2010/0068456 A1* | 3/2010 | Hsu | H05K 5/0243 428/137 |
| 2010/0075105 A1* | 3/2010 | Su | B44C 5/0453 428/189 |
| 2010/0098890 A1* | 4/2010 | Hou | B05D 5/068 204/192.12 |
| 2010/0143672 A1* | 6/2010 | Li | G06F 1/1626 428/201 |
| 2010/0151168 A1* | 6/2010 | Huang | B29C 45/14811 428/34.1 |
| 2010/0167027 A1* | 7/2010 | Jiang | B05D 7/57 428/209 |
| 2010/0247859 A1* | 9/2010 | Park | B29C 45/0053 428/141 |
| 2011/0014405 A1* | 1/2011 | Li | H05K 5/0243 428/35.9 |
| 2011/0014461 A1 | 1/2011 | Li et al. | |
| 2011/0091690 A1* | 4/2011 | Lin | B32B 27/40 428/161 |
| 2011/0143062 A1* | 6/2011 | Chiang | C23C 14/083 428/34.1 |
| 2011/0151209 A1* | 6/2011 | Li | H05K 5/0243 428/209 |
| 2011/0159243 A1* | 6/2011 | Ahn | B44F 1/08 428/164 |
| 2011/0195224 A1* | 8/2011 | Zhang | B29C 45/14221 264/261 |
| 2011/0247854 A1* | 10/2011 | Chen | H05K 5/0243 174/50 |
| 2011/0268900 A1* | 11/2011 | Lin | B32B 1/06 428/34.1 |
| 2011/0281074 A1* | 11/2011 | Nagashima | B44F 1/045 428/164 |
| 2013/0045781 A1* | 2/2013 | Tho | H04M 1/0283 455/575.1 |
| 2013/0052476 A1* | 2/2013 | Zhu | B32B 1/00 204/192.15 |
| 2013/0105299 A1* | 5/2013 | Kim | C23C 14/044 204/192.15 |
| 2013/0164472 A1* | 6/2013 | Liu | C09D 11/037 428/34.1 |
| 2013/0260102 A1* | 10/2013 | Liao | B41M 1/20 427/265 |
| 2014/0100005 A1* | 4/2014 | Bae | B29C 45/1418 455/575.8 |
| 2014/0118903 A1* | 5/2014 | Hwang | C23C 14/30 427/407.1 |
| 2014/0248471 A1* | 9/2014 | Hanschen | B29C 48/21 425/133.5 |
| 2016/0089849 A1* | 3/2016 | Kayanoki | B32B 27/08 264/259 |
| 2016/0212870 A1 | 7/2016 | Hu et al. | |
| 2017/0015802 A1* | 1/2017 | Hall | C23C 14/205 |
| 2017/0347476 A1* | 11/2017 | Hwang | C25D 11/12 |
| 2018/0054904 A1* | 2/2018 | Dejneka | B44F 1/10 |
| 2019/0113655 A1* | 4/2019 | Bee | A43B 1/0027 |
| 2019/0291504 A1* | 9/2019 | Cho | G02B 5/0257 |
| 2020/0001640 A1* | 1/2020 | Fenton | B44F 1/06 |
| 2020/0062027 A1* | 2/2020 | Shon | B44F 1/10 |
| 2020/0355974 A1* | 11/2020 | Kim | B32B 3/30 |
| 2021/0016540 A1* | 1/2021 | Jo | C08J 7/0423 |
| 2021/0029234 A1* | 1/2021 | Gao | H04M 1/185 |
| 2021/0030134 A1* | 2/2021 | Kim | G02B 5/045 |
| 2021/0061000 A1* | 3/2021 | Song | B32B 3/00 |
| 2021/0072442 A1* | 3/2021 | Lin | C23C 28/42 |
| 2021/0124100 A1* | 4/2021 | Kim | B32B 3/30 |
| 2021/0170785 A1* | 6/2021 | Kim | A45D 33/006 |
| 2021/0222285 A1* | 7/2021 | Takazaki | C23C 14/0015 |
| 2021/0333451 A1* | 10/2021 | Song | G02B 5/1842 |
| 2021/0347687 A1* | 11/2021 | Jo | C23C 14/5873 |
| 2023/0161089 A1* | 5/2023 | Jo | C03C 17/245 428/34.1 |

FOREIGN PATENT DOCUMENTS

| | | | |
|---|---|---|---|
| CN | 1840732 A | * | 10/2006 |
| CN | 101108570 A | * | 1/2008 |
| CN | 101358349 A | * | 2/2009 |
| CN | 101565815 A | * | 10/2009 |
| CN | 101608297 A | * | 12/2009 |
| CN | 101629277 A | * | 1/2010 |

(56) References Cited

FOREIGN PATENT DOCUMENTS

| | | | | | |
|---|---|---|---|---|---|
| CN | 101695690 | A | * | 4/2010 | |
| CN | 101758012 | A | * | 6/2010 | ............ B05D 5/06 |
| CN | 101955594 | A | | 1/2011 | |
| CN | 102189070 | A | * | 9/2011 | |
| CN | 202121883 | U | * | 1/2012 | |
| CN | 102458060 | A | * | 5/2012 | |
| CN | 102725663 | A | | 10/2012 | |
| CN | 102858100 | A | * | 1/2013 | |
| CN | 102991253 | A | * | 3/2013 | |
| CN | 104247058 | A | | 12/2014 | |
| CN | 104529186 | A | * | 4/2015 | |
| CN | 104549947 | A | * | 4/2015 | |
| CN | 104582362 | A | * | 4/2015 | |
| CN | 105116964 | A | * | 12/2015 | |
| CN | 105268618 | A | * | 1/2016 | |
| CN | 204948568 | U | | 1/2016 | |
| CN | 105291674 | A | * | 2/2016 | |
| CN | 205115585 | U | * | 3/2016 | |
| CN | 205365001 | U | * | 7/2016 | ............ B32B 1/00 |
| CN | 106399926 | A | * | 2/2017 | |
| CN | 106534418 | A | * | 3/2017 | ........... C23C 14/083 |
| CN | 106987820 | A | * | 7/2017 | ............ C23C 14/505 |
| CN | 206306700 | U | | 7/2017 | |
| CN | 107105587 | A | * | 8/2017 | |
| CN | 107205328 | A | * | 9/2017 | ............ C23C 14/08 |
| CN | 206684336 | U | | 11/2017 | |
| CN | 206807510 | U | | 12/2017 | |
| CN | 206908637 | U | | 1/2018 | |
| CN | 206908638 | U | | 1/2018 | |
| CN | 107672151 | A | * | 2/2018 | ......... B29C 33/3842 |
| CN | 107840583 | A | * | 3/2018 | ......... C03C 17/3602 |
| CN | 107896447 | A | * | 4/2018 | ........... H05K 5/0243 |
| CN | 207181730 | U | | 4/2018 | |
| CN | 207274250 | U | | 4/2018 | |
| CN | 108063844 | A | * | 5/2018 | |
| CN | 108153936 | A | * | 6/2018 | ............ B41M 1/12 |
| CN | 108179384 | A | * | 6/2018 | ........... C23C 14/044 |
| CN | 108263141 | A | * | 7/2018 | |
| CN | 108300964 | A | * | 7/2018 | ............ C23C 14/022 |
| CN | 108347496 | A | * | 7/2018 | |
| CN | 207612492 | U | | 7/2018 | |
| CN | 207793403 | U | | 8/2018 | |
| CN | 108551740 | A | * | 9/2018 | |
| CN | 108583131 | A | * | 9/2018 | |
| CN | 207877590 | U | | 9/2018 | |
| CN | 108697012 | A | * | 10/2018 | |
| CN | 207954907 | U | | 10/2018 | |
| CN | 207969158 | U | * | 10/2018 | |
| CN | 108724858 | A | * | 11/2018 | ........... B32B 17/064 |
| CN | 108745828 | A | * | 11/2018 | |
| CN | 108947590 | A | * | 12/2018 | ............ C04B 41/52 |
| CN | 109348660 | A | | 2/2019 | |
| CN | 209170430 | U | * | 7/2019 | |
| CN | 209170431 | U | * | 7/2019 | |
| DE | 10242335 | A1 | * | 4/2003 | ............ B05D 5/065 |
| DE | 102009036218 | A1 | | 6/2010 | |
| DE | 202014105598 | U1 | * | 2/2015 | ............ B44C 1/00 |
| EP | 591076 | A1 | * | 4/1994 | ............ B44F 1/08 |
| JP | 06031862 | A | * | 2/1994 | |
| JP | 07089775 | A | * | 4/1995 | ............ C04B 33/00 |
| JP | 2002096017 | A | * | 4/2002 | |
| JP | 2003054200 | A | | 2/2003 | |
| JP | 2004338984 | A | | 12/2004 | |
| JP | 2005205787 | A | | 8/2005 | |
| JP | 2006026948 | A | * | 2/2006 | |
| JP | 2009213788 | A | * | 9/2009 | |
| JP | 2010108749 | A | | 5/2010 | |
| JP | 2011002491 | A | * | 1/2011 | |
| JP | 2011140126 | A | * | 7/2011 | |
| JP | 2013119188 | A | | 6/2013 | |
| JP | 5615567 | B2 | | 10/2014 | |
| JP | 2016074120 | A | * | 5/2016 | |
| KR | 2009114676 | A | * | 11/2009 | ............ G06F 1/181 |
| KR | 2012007338 | A | | 1/2012 | |
| KR | 2013012783 | A | * | 2/2013 | ........... H05K 5/0017 |
| KR | 2015114625 | A | * | 10/2015 | |
| KR | 2017114570 | A | * | 10/2017 | ............ B41M 1/32 |
| KR | 2018059152 | A | * | 6/2018 | ............ B41M 1/10 |
| KR | 2018064024 | A | * | 6/2018 | ............ B41M 1/10 |
| WO | WO-2012073994 | A1 | * | 6/2012 | ............ B41M 3/008 |
| WO | WO-2012130059 | A1 | * | 10/2012 | |
| WO | 2018103142 | A1 | | 6/2018 | |
| WO | 2018164464 | A1 | | 9/2018 | |
| WO | WO-2019201325 | A1 | * | 10/2019 | ....... B32B 17/10018 |
| WO | WO-2020098416 | A1 | * | 5/2020 | ............ B32B 17/06 |

OTHER PUBLICATIONS

Machine Translation of CN-108697012-A, Oct. 2018 (Year: 2018).*
Machine Translation of CN-108263141-A, Jul. 2018 (Year: 2018).*
Translation of CN-101758012-A, Jun. 2010 (Year: 2010).*
Translation of CN105291674A, Feb. 2016 (Year: 2016).*
Translation of CN-106399926-A, Feb. 2017 (Year: 2017).*
Translation of CN-107205328-A, Sep. 2017 (Year: 2017).*
Translation of CN-107840583-A, Mar. 2018 (Year: 2018).*
Translation of CN-108745828-A, Nov. 6, 2018 (Year: 2018).*
Chen et al., Classification and Flammability Analysis on Automobile Interior Materials, Bus & Coach Technology and Research, 2015, 3, pp. 40-42, dated Dec. 31, 2015.
International Search Report and Written Opinion issued in corresponding PCT Application No. PCT/CN2019/108427, dated Dec. 27, 2019.
Li, The Craft Study on ZIN Decorative Coatings by Medium-Frequency Reactive Magnetron Sputtering Technique, Master's Thesis submitted to Agricultural University of Hebei, dated Dec. 31, 2005.

* cited by examiner

DECORATIVE SHEET AND COVER PLATE FOR CONSUMER ELECTRONIC PRODUCT

CROSS-REFERENCE TO RELATED APPLICATIONS

The application is a continuation of International Application No. PCT/CN2019/108427 filed on Sep. 27, 2019, which claims priority of Chinese patent application 201811368005.4, filed on Nov. 16, 2018. Both applications are incorporated herein by reference in their entireties.

TECHNICAL FIELD

The present application relates to a decorative sheet and a cover plate for a consumer electronic product.

BACKGROUND

At present, with the rapid development of the consumer electronics industry, technological innovation and functional innovation are constantly being sought by various manufacturers to cater to the development trend of environmental protection, energy saving and differentiation. The design of consumer electronic products is not only limited to the improvement of functions, many designers have turned their attention to the design of the appearance of consumer electronic products. Take the mobile phone as an example, the cover of the mobile phone not only protects the parts inside, but also plays a role in beautifying and decorating. The design of the mobile phone cover with excellent decorative effect can not only increase the value of the mobile phone, but also improve the user experience, increase the user's choice of mobile phone shape, making mobile phones more popular among users.

However, the current decorative design of the cover plate for the mobile phone focuses on the replacement of the material of the substrate of the cover plate (such as glass, metal, plastic) or the replacement of the single color of the printing ink layer on the substrate of the cover plate, which results in a single vision, so that the decorative effect is poor and the recognition is low.

SUMMARY

In view of this, it is necessary to provide a decorative sheet for solving the problem mentioned above.

A technical solution of the decorative sheet of the present invention includes the following contents.

A decorative sheet, including:
  a supporting layer;
  a solid film layer, disposed on the supporting layer and presenting a color, and the solid film layer includes a single layer or a composite layer,
  a thickness and/or material of at least one layer in the solid film layer is set to be varied.

In an embodiment, the thickness of at least one layer in the solid film layer varies gradually, regularly or randomly.

In an embodiment, the solid film layer includes a plurality of film layers stacked, and the plurality of film layers are combined to form the solid film layer.

In an embodiment, a thickness of one of the plurality of film layers is set to be varied gradually in one direction.

In an embodiment, a thickness of one of the plurality of film layers gradually thins, gradually thickens, first thins and then thickens, first thickens and then thins, alternates between thinning and thickening, gradually thins and then gradually thickens or gradually thickens and then gradually thins from one side to the other side.

In an embodiment, a thickness of each of the plurality of film layers is set to be varied gradually, or be varied gradually in one direction with a same or different tendency.

In an embodiment, thicknesses of two adjacent film layers in the plurality of film
  layers are set to be complementary.

In an embodiment, one side surface of one of the plurality of film layers is an undulating or curved surface.

In an embodiment, materials of at least two regions of at least one layer in the solid film layer are different.

In an embodiment, the solid film layer includes one or a plurality of film layers, one of the film layers includes a first region with a first material, a second region with a second material, and a third region with the first material and the second material mixed.

In an embodiment, the solid film layer includes the plurality of film layers, at least two of the plurality of film layers have the first region, the second region and the third region, respectively, and the first region, the second region, and the third region of the at least two of the plurality of film layers are disposed in identical, partially identical, or completely different positions.

In an embodiment, the solid film layer is a composite layer, the solid film layer includes a plurality of partitions and a junction region between adjacent partitions in the plurality of partitions, and a material of at least one layer of the plurality of partitions is different.

In an embodiment, the solid film layer is an evaporative plating layer, a sputtering plating layer, an electroless plating layer or an electroplating layer.

In an embodiment, the supporting layer is a PET layer, a PMMA layer, a PC layer, a glass layer, an organic glass layer, a PI layer or a PMMA composite layer.

In an embodiment, the solid film layer is a composite layer, and is disposed on both sides of the supporting layer.

The present application further discloses a cover plate for a consumer electronic product including the decorative sheet described above.

The beneficial effects of the present application: through the change of the thickness and/or material of the solid film layer, the color of the solid film layer can be changed, including shade changes, color changes and other variety changes, so that the decorative sheet has rich color, rich vision, better decoration effect and higher recognition degree.

DETAILED DESCRIPTION OF THE EMBODIMENTS

Figure 1:
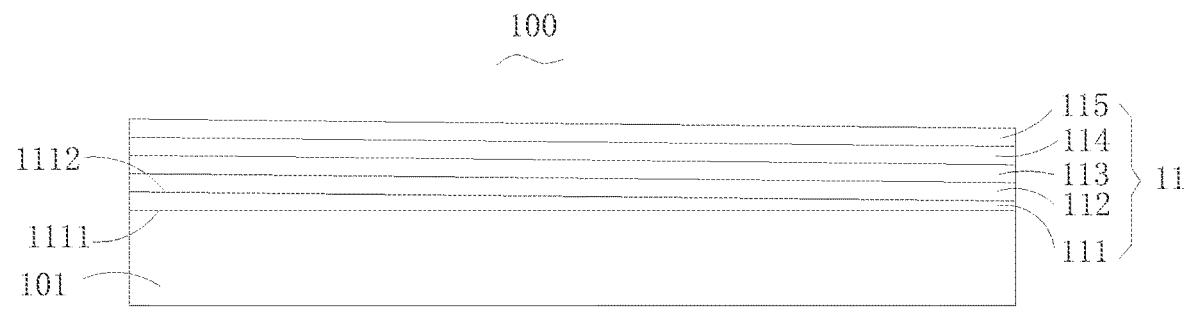
FIG. 1 is a schematic structural diagram of a decorative sheet of the present application.

To facilitate the understanding of the present application, the application will be described more fully below with reference to the relevant drawings. The preferred embodiments of the present application are shown in the drawings. However, the present application can be implemented in many different forms and is not limited to the embodiments described below. On the contrary, the purpose of providing these embodiments is to make the disclosure of the present application more thorough and comprehensive.

Unless otherwise defined, all technical and scientific terms used herein have the same meaning as commonly understood by those skilled in the art. The terms used in the specification of the present application herein is only for the purpose of describing specific embodiments, and is not intended to limit the present application. The term "and/or" as used herein includes any and all combinations of one or more related listed items.

The present application discloses a decorative sheet, including a supporting layer and a solid film layer. The solid film layer is disposed on the supporting layer and presents a color. The solid film layer includes a single layer or a composite layer. A thickness and/or material of at least one layer in the solid film layer is set to be varied. In the decorative sheet of the present application, through the change of the thickness and/or material of the solid film layer, the color of the solid film layer can be changed, including shade changes, color changes and other variety changes, so that the decorative sheet has rich color, rich vision, better decoration effect and higher recognition.

In an embodiment, the thickness of at least one layer in the solid film layer varies gradually, regularly or randomly. In a single layer, the color of a same material at different thicknesses is different. Different changes of the thickness achieve the change of the color, and a preset color is obtained finally with the color of other layers. A change of the thickness may be a gradual change in one or more directions, a change in a preset rule or a random change, to obtain a gradation color, a regularly changed color, or a random color. A change of color includes a change in color depth (for example, gradually changing from light pink to darker) and a change in color type (for example, changing from red to blue).

In an embodiment, the solid film layer includes a plurality of film layers stacked, and the plurality of film layers are combined to form the solid film layer. Preferably, the solid film layer includes 5-8 film layers. For example, the solid film layer includes 5 film layers, namely Si layer, Ti layer, Si layer, Ti layer, Si layer, which are sequentially plated on one side of the supporting layer. The Si layer here refers to a film layer mainly containing Si, such as a $SiO_2$ layer, referred to as Si layer for short; the Ti layer here refers to a film layer mainly containing Ti, such as a $Ti_3O_5$ layer, referred to as Ti layer for short; the same below.

In an embodiment, a thickness of one of the plurality of film layers is set to be varied gradually in one direction. The thickness of at least one film layer is set to be varied gradually. The color of an area with a gradual thickness presents a gradual change, which may be a gradual change of shade or a gradual transition from one color to the other.

In an embodiment, a thickness of one of the plurality of film layers gradually thins, gradually thickens, first thins and then thickens, first thickens and then thins, alternates between thinning and thickening, gradually thins and then gradually thickens or gradually thickens and then gradually thins from one side to the other side. For example, the thickness of the Si layer closest to the supporting layer, among the above mentioned solid film layer with 5 film layers, gradually becomes thicker from one side to the other.

In an embodiment, a thickness of each of the plurality of film layers is set to be varied gradually, or be varied gradually in one direction with a same or different tendency. Taking the above 5 layers as an example, the thickness of each layer may thin gradually from the left to the right, or one layer may thin from the left to the right, while the adjacent layer thins from the right to the left.

In an embodiment, thicknesses of two adjacent film layers in the plurality of film layers are set to be complementary.

In an embodiment, one side surface of one of the plurality of film layers is an undulating or curved surface. That is, one side surface of the film layer is not a flat surface, which causes the thickness of the film layer to change, thereby realizing a variety of colors.

In an embodiment, the materials of at least two regions of at least one layer in the solid film layer are different. The difference in materials means that materials forming different regions of the film layer are different. The difference in materials refers to difference in content, type, specific gravity, and the like.

In an embodiment, the solid film layer includes one or a plurality of film layers, one of the film layers includes a first region with a first material, a second region with a second material, and a third region with the first material and the second material mixed.

The first region presents a color, the second region presents another color, and the third region presents a transitional color, a mixed color, or a third color. Cooperating with other film layers, the gradual change and type change of the color are realized.

In an embodiment, the solid film layer includes a plurality of film layers, at least two of the plurality of film layers have the first region, the second region and the third region, respectively. The first region, the second region, and the third region of the at least two of the plurality of film layers are disposed in identical, partially identical, or completely different positions. The position distribution or size of each region is the same or different. The color presented by the solid film layer is richer.

In an embodiment, the solid film layer is a composite layer, the solid film layer includes a plurality of partitions and a junction region between adjacent partitions in the plurality of partitions, and a material of at least one layer of the plurality of partitions is different. With the material change of one or more layers, the color change of the solid film layer is realized.

The decorative sheet of the present application realizes the color change through the change setting of the solid film layer. Specifically, the change of the thickness and/or the change of the material of the solid film layer may be only the change of the thickness, or only the change of the material, or double changes of the material and the thickness, or the change of thickness in one part and the change of material in the other part. Therefore, the solid film layer can realize colorful changes, to have a better decorative effect, and a higher degree of recognition.

In an embodiment, the solid film layer is an evaporative plating layer, a sputtering plating layer, an electroless plating layer or an electroplating layer. In other embodiments, the solid film layer may also be formed by printing, screen printing, and the like.

In an embodiment, the supporting layer is a PET layer, a PMMA layer, a PC layer, a glass layer, an organic glass layer, a PI layer or a PMMA composite layer. The supporting layer may be a single layer or a composite layer and it may be transparent and colorless, transparent and colored, or opaque.

In an embodiment, the solid film layer is a composite layer with a plurality of layers, and is disposed on both sides of the supporting layer.

The present application also discloses a cover plate for a consumer electronic product, which includes the decorative sheet described above. For example, a back cover of a mobile phone with the above-mentioned decorative sheet can present changing colors, so that the decoration effect is excellent, and the recognition degree is high.

Hereinafter, the decorative sheet is described with examples with reference to the figure.

Referring to FIG. 1, the present application discloses a decorative sheet 100, including a supporting layer 101 and a solid film layer 11. The solid film layer 11 is formed on the supporting layer 101. The solid film layer 11 is a composite layer with a plurality of film layers stacked. In the embodiment, there are 5 film layers in the solid film layer: a first film layer 111, a second film layer 112, a third film layer 113, a fourth film layer 114 and a fifth film layer 115. The thickness of the first film layer 111 is gradually thinning from left to right as showed in FIG. 1. The first film layer 111 includes a bottom surface 1111 and a top surface 1112 disposed oppositely. The bottom surface 1111 is in contact with the supporting layer 101, and the top surface 1112 is an inclined plane. The second film layer 112, the third film layer 113, the fourth film layer 114 and the fifth film layer 115 are sequentially stacked on the first film layer 111, and upper and lower side surfaces of the second to fifth film layers are all inclined and have uniform thicknesses.

The top surface 1112 is inclined, the thickness of the first film layer 111 gradually changes in one direction, and the change in thickness causes the solid film layer 11 to present different colors, including different shades and different types. It may be that only the first film layer 111 presents a changed color, or the first film layer 111 is matched or blended with one or more of the second to fifth film layers to present a changed color. Of course, the supporting layer 101 may also assist in color presenting, that is, the supporting layer 101 is a colored layer, such as colored PET.

The first film layer 111 in the solid film layer 11 of the decorative sheet 100 has a gradually changed thickness. In other embodiments, the thickness of one or more film layers is set to be varied.

Figure 2:
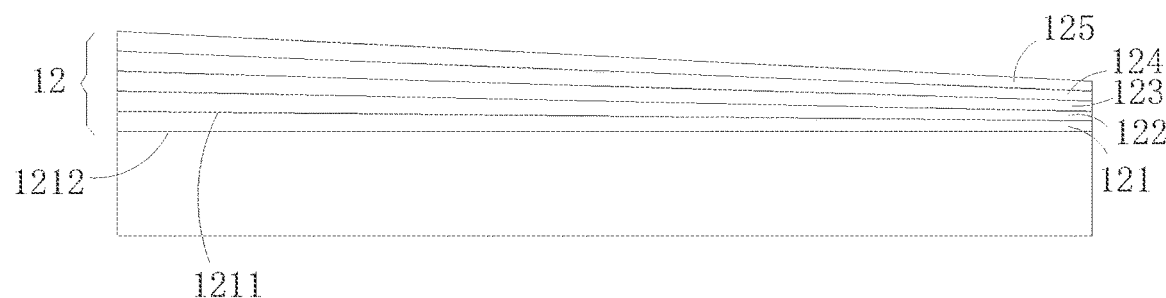
FIG. 2 is another schematic structural diagram of a decorative sheet of the present application.

Referring to FIG. 2, a solid film layer 12 includes a first film layer 121, a second film layer 122, a third film layer 123, a fourth film layer 124 and a fifth film layer 125. The thickness of the first layer 121 gradually becomes thinner from one side to the other (such as from the left to the right as showed in FIG. 2). The second film layer 122 is formed on the first film layer 121 and its thickness gradually becomes thinner from the left to the right. The third, fourth, and fifth film layers 123, 124, 125 are sequentially formed and their thicknesses gradually become thinner from the left to the right. The thickness of the left end of the first to fifth film layers 121-125 is the same as the thickness of the right end, a bottom surface 1211 of the first film layer 121 is a horizontal plane, and an opposite top surface 1212 is an inclined surface. The second to fifth film layers are stacked in sequence. The bottom surface 1211 and the top surface 1212 are both inclined surfaces, and the inclination angle of the top surface 1212 is greater than that of the bottom surface 1211.

Figure 3:
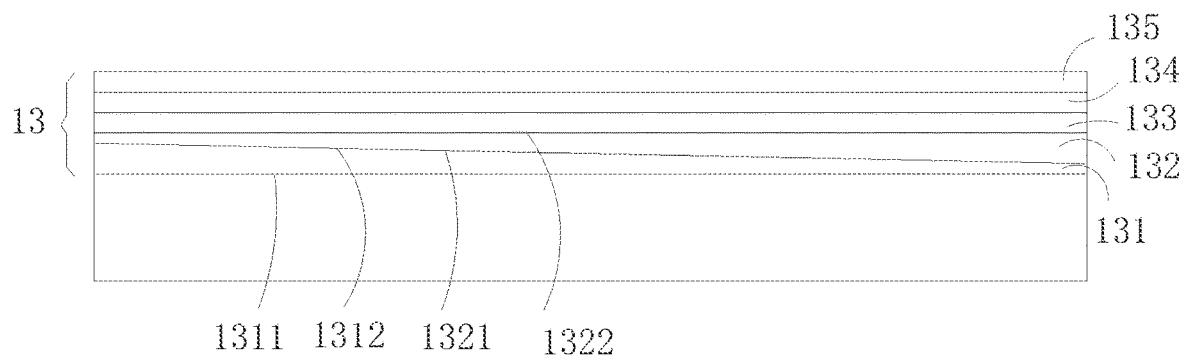
FIG. 3 is another schematic structural diagram of a decorative sheet of the present application.

Referring to FIG. 3, a solid film layer 13 includes a first film layer 131, a second film layer 132, a third film layer 133, a fourth film layer 134 and a fifth film layer 135. The thickness of the first layer 131 gradually becomes thinner from one side to the other. The second film layer 132 is formed on the first film layer 131 and its thickness gradually becomes thicker from the left to the right. A bottom surface 1311 of the first film layer 131 is a horizontal plane, and an opposite top surface 1312 is an inclined surface. A bottom surface 1321 of the second film layer 132 is an inclined surface, and an opposite top surface 1322 is a horizontal plane. The top surface 1312 of the first film layer 131 is attached to the bottom surface 1321 of the second film layer 132, and the thicknesses of the first film layer 131 and the second film layer 132 are complementary to each other.

Figure 4:
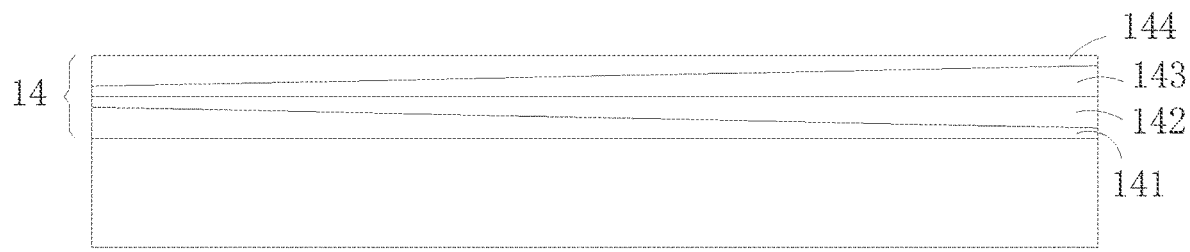
FIG. 4 is another schematic structural diagram of a decorative sheet of the present application.

Referring to FIG. 4, a solid film layer 14 includes a first film layer 141, a second film layer 142, a third film layer 143 and a fourth film layer 144. The thicknesses of the first to fourth film layers are all set to be varied gradually, and the gradation trend is alternated. The first film layer 141 and the second film layer 142 are complementary to each other, and the third film layer 143 and the fourth film layer 143 are complementary to each other.

Figure 5:
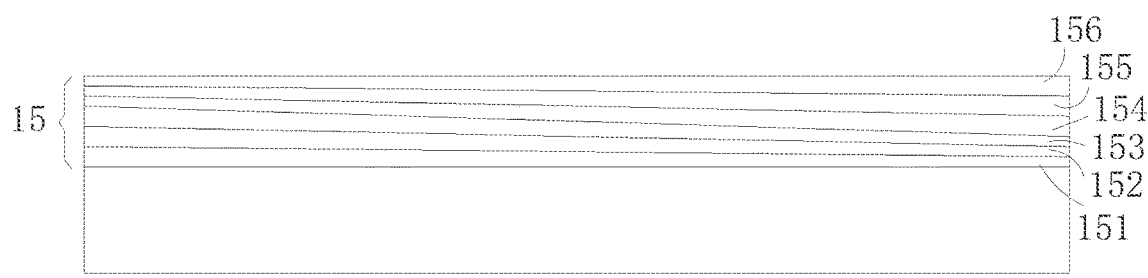
FIG. 5 is another schematic structural diagram of a decorative sheet of the present application.

Referring to FIG. 5, a solid film layer 15 includes a first film layer 151, a second film layer 152, a third film layer 153, a fourth film layer 154, a fifth film layer 155 and a sixth film layer 156. The thicknesses of the first to sixth film layers are respectively set to be varied gradually. The gradation trends of the first film layer 151, the second film layer 152 and the third film layer 153 are the same. The gradation trends of the fourth film layer 154, the fifth film layer 155 and the six film layers 156 are the same. The thickness of the solid film layer 15 is uniform.

Figure 6:
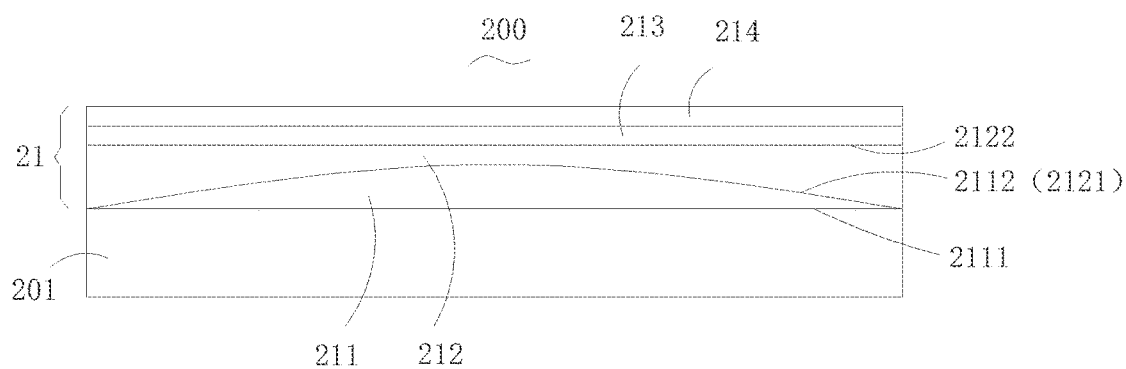
FIG. 6 is another schematic structural diagram of a decorative sheet of the present application.

Referring to FIG. 6, the present application discloses another decorative sheet 200, including a supporting layer 201 and a solid film layer 21. The solid film layer 21 is formed on the supporting layer 201. The solid film layer 21 includes a first film layer 211, a second film layer 212, a third film layer 213 and a fourth film layer 214. A bottom surface 2111 of the first film layer 211 is attached to the supporting layer 201. A top surface 2112 of the first film layer 211 is a curved surface. Take the illustrated cross section as an example, from the left to the right, the thickness of the first film layer 211 gradually increases and then gradually decreases. A bottom surface 2121 of the second film layer 212 is attached to the top surface 2112 of the first film layer 211, and a top surface 2122 of the second film layer 212 is a horizontal plane. The change in thickness causes the solid film layer 21 to present different colors, including different shades and different types. The top surface 2112 of the first film layer 211 is a curved surface, the degree of gradation is gentler, and the color change is slower.

Figure 7:
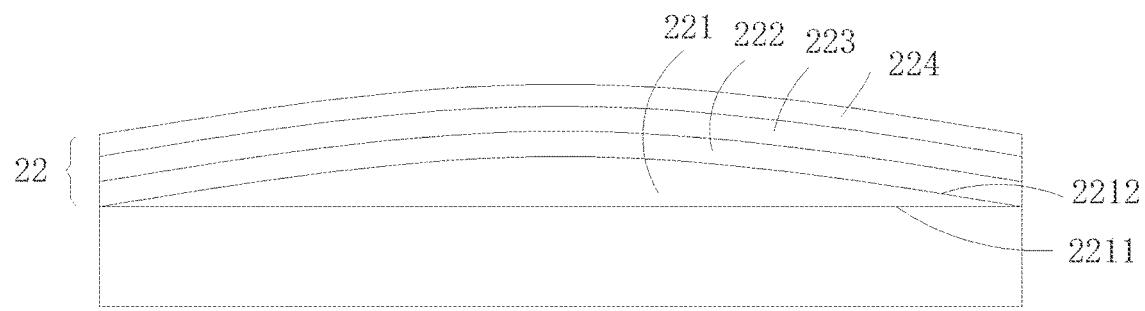
FIG. 7 is another schematic structural diagram of a decorative sheet of the present application.

In other embodiments, referring to FIG. 7, a solid film layer 22 includes a first film layer 221, a second film layer 222, a third film layer 223 and a fourth film layer 224. A bottom surface 2211 of the first film layer 221 is attached to the supporting layer 201, a top surface 2212 of the first film layer 221 is a curved surface, and the thickness of the first film layer 221 gradually increases and then gradually decreases. The thicknesses of the second film layer 222, the third film layer 223 and the fourth film layer 224 are uniform, but they are arranged conformally with the top surface 2212 of the first film layer 221.

Figure 8:
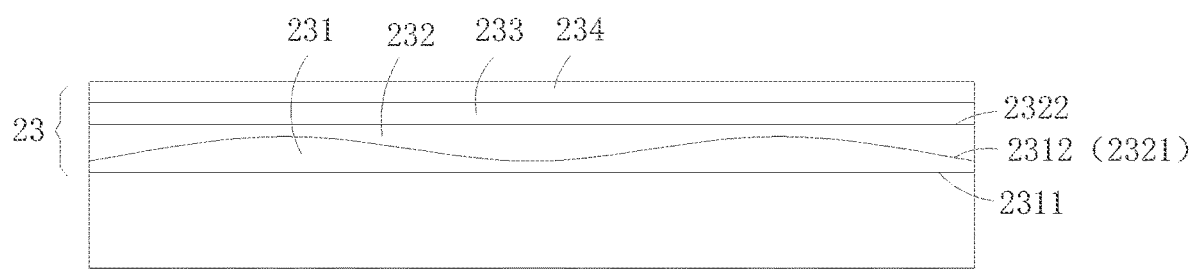
FIG. 8 is another schematic structural diagram of a decorative sheet of the present application.

In other embodiments, referring to FIG. 8, a solid film layer 23 includes a first film layer 231, a second film layer 232, a third film layer 233 and a fourth film layer 234. A bottom surface 2311 of the first film layer 231 is attached to the supporting layer 201, and a top surface 2312 of the first film layer 231 is an undulating curved surface, that is, the thickness of the first film layer 231 is varied. A bottom surface 2321 of the second film layer 232 is attached to the surface 2312 of the first film layer 231, and a top surface of the second film layer 232 is a horizontal plane. The thicknesses of the third film layer 233 and the fourth film layer 234 are uniform.

Figure 9:
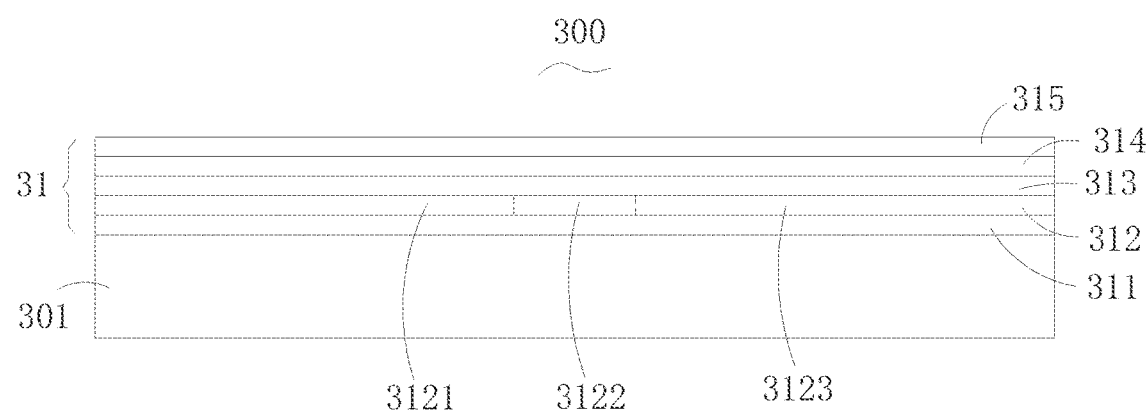
FIG. 9 is another schematic structural diagram of a decorative sheet of the present application.

Referring to FIG. 9, the present application discloses another decorative sheet 300, including a supporting layer 301 and a solid film layer 31. The solid film layer 31 is formed on the supporting layer 301. The solid film layer 31 includes a first film layer 311, a second film layer 312, a third film layer 313, a fourth film layer 314 and a fifth film layer 315. The first to fifth film layers are stacked in sequence and the thickness of each layer is uniform. The material of the first film layer 311 is Si, the material of the third film layer 313 is Si, the material of the fourth film layer 314 is Ti, and the material of the fifth film layer 315 is Si. The second film layer includes a first region 3121 with a first material, a second region 3122 with a second material, and a third region 3123 with the first material and the second material mixed. The third region 3123 is located at a junction between the first region 3121 and the second region 3122. Preferably, the first material is Ti, while the second material is Al. Then, the first region 3121, the second region 3122 and the third region 3123 of the second film layer can present different colors. Combined with other film layers, the solid film layer 31 can present different colors in different regions, including different shades and/or different types, and the like. A same film layer is divided into three regions with different materials. The three regions may or may not have obvious area boundaries. Of course, it may also be divided into four, five or more regions to meet the complexity and variety of the color.

Figure 10:
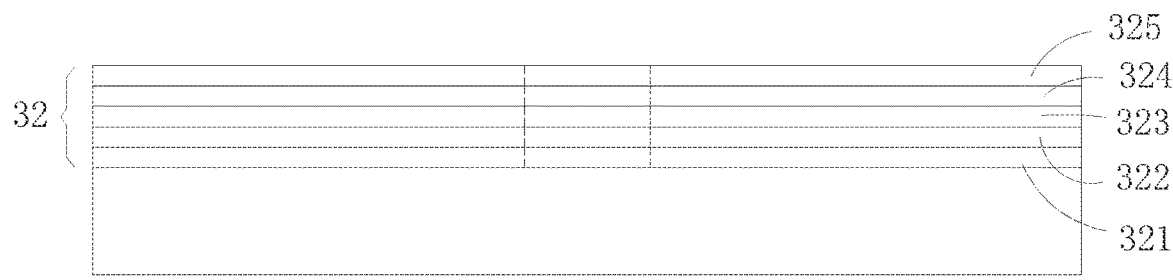
FIG. 10 is another schematic structural diagram of a decorative sheet of the present application.

In other embodiments, referring to FIG. 10, a solid film layer 32 includes a first film layer 321, a second film layer 322, a third film layer 323, a fourth film layer 324 and a fifth film layer 325. The first to fifth solid film layers are stacked in sequence, and each film layer is divided into a first region with a first material, a second region with a second material, and a third region with the first material and the second material mixed. The third region is located at the junction of the first region and the second area. The first region, the second region and the third region of the first to fifth film layers are respectively arranged up and down correspondingly. The first region of each layer is substantially located at the same position and has substantially the same area and is stacked up and down, the second region of each layer is substantially located at the same position and has substantially the same area and is stacked up and down, and the third region of each layer is substantially located at the same position and has substantially the same area and is stacked up and down. Of course, the material of the first region of each film layer may be the same or different, the material of the second region of each film layer may be the same or different, and the material of the third region of each film layer may be the same or different.

Figure 11:
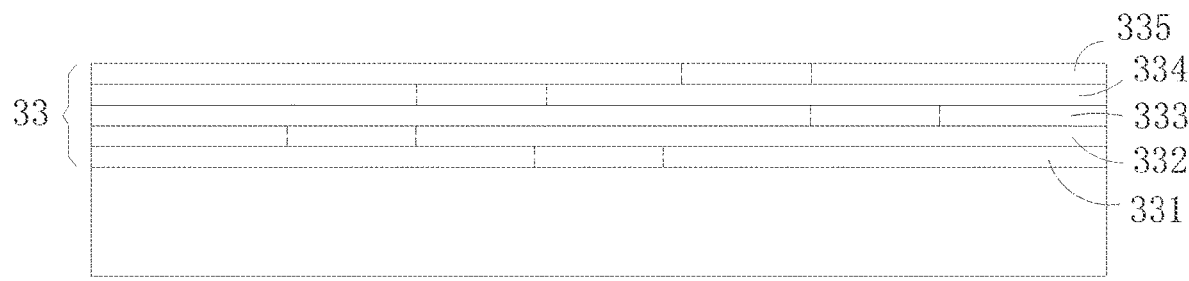
FIG. 11 is another schematic structural diagram of a decorative sheet of the present application.

In other embodiments, referring to FIG. 11, a solid film layer 33 includes a first film layer 331, a second film layer 332, a third film layer 333, a fourth film layer 334 and a fifth film layer 335. The first to fifth solid film layers are stacked in sequence, and each layer have a first region with a first material, a second region with a second material, and a third region with the first material and the second material mixed. The third region is located at the junction of the first region and the second region. The sizes and positions of the first region, the second region, and the third region of each layer of the first to fifth film layers are random, and are not arranged in a one-to-one correspondence, and the materials of each region may be the same or different.

Figure 12:
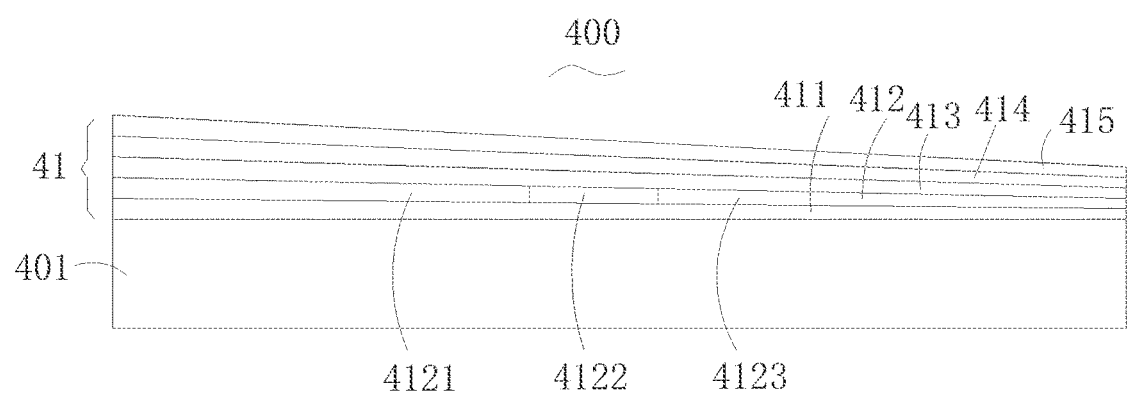
FIG. 12 is another schematic structural diagram of a decorative sheet of the present application.

Referring to FIG. 12, the present application discloses another decorative sheet 400, including a supporting layer 401 and a solid film layer 41. The solid film layer 41 is formed on the supporting layer 401. The solid film layer 41 includes a first film layer 411, a second film layer 412, a third film layer 413, a fourth film layer 414 and a fifth film layer 415. The thicknesses of the first to fifth layers gradually thin from one side to the other side. The material of the first film layer 411 is Si, the material of the third film layer 413 is Si, the material of the fourth film layer 414 is Ti, and the material of the fifth film layer 415 is Si. The second film layer 412 includes a first region 4121 with a first material, a second region 4122 with a second material, and a third region 4123 with the first material and the second material mixed. The third region 4123 is located at the junction of the first region 4121 and the second region 4122. Preferably, the first material is Ti while the second material is Al. The thickness and material of the solid film layer 41 of the decorative sheet 400 is varied to present changed color, including shade change and type change. By the setting of thickness, the setting of the rate of thickness change, the choice of material and the amount of material, various changes of color may be achieved.

Figure 13:
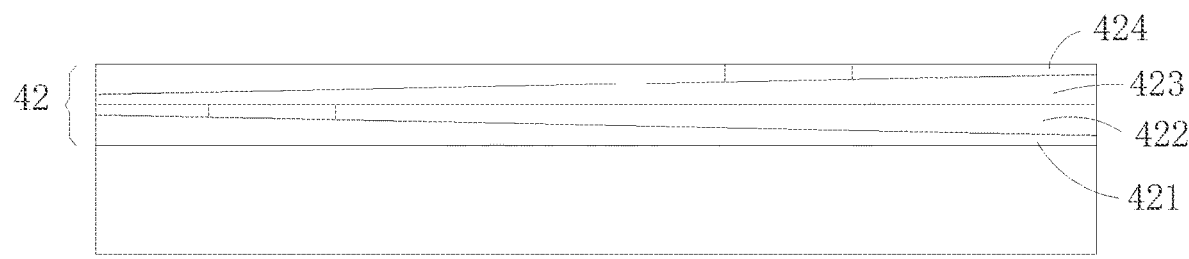
FIG. 13 is another schematic structural diagram of a decorative sheet of the present application.

In other embodiments, as shown in FIG. 13, a solid film layer 42 includes a first film layer 421, a second film layer 422, a third film layer 423 and a fourth film layer 424. The thicknesses of the first film layer 421 and the second film layer 422 are respectively varied gradually and have opposite gradation trends, and the thicknesses of the third film layer 423 and the fourth film layer 424 are respectively varied gradually and have opposite gradation trends. The second film layer 422 and the fourth film layer 424 have three regions with different materials, respectively. Various changes of color may be achieved.

Figure 14:
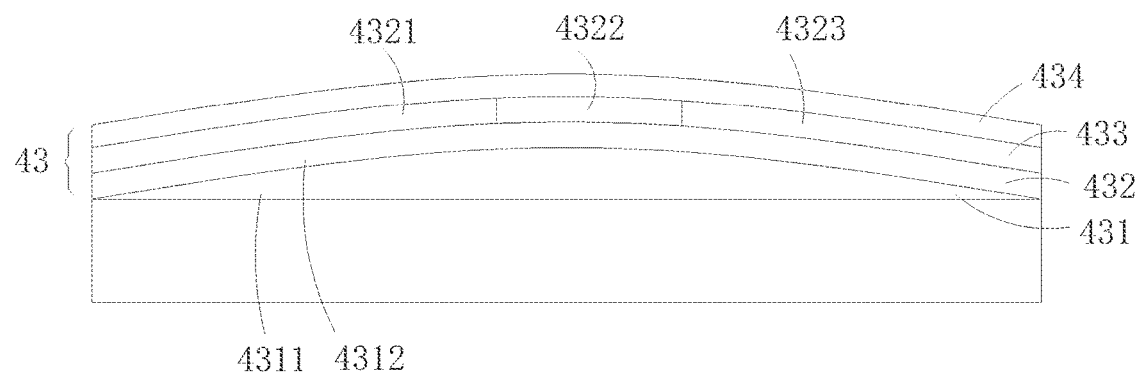
FIG. 14 is another schematic structural diagram of a decorative sheet of the present application.

In other embodiments, as shown in FIG. 14, a solid film layer 43 includes a first film layer 431, a second film layer 432, a third film layer 433 and a fourth film layer 434. The first film layer 431 includes a bottom surface 4311 and a top surface 4312, the bottom surface 4311 is attached to the supporting layer 401, and the top surface 4312 is a curved surface. The thickness of the first film layer 431 gradually becomes thicker and then gradually becomes thinner from one side to the other side. The second film layer 432, the third film layer 433, and the fourth film layer 434 are sequentially stacked on the first film layer 431, and the thickness of each layer is uniform. The second film layer 432 includes a first region 4321 with a first material, a second region 4322 with a second material, and a third region 4323 with the first material and the second material mixed. Various changes of color may be achieved.

In order to make the objective, technical features and advantage of the present application more obvious and understandable, embodiments of the present application are described in detail above with reference to the accompanying drawings. In the above description, many specific details are set forth in order to provide a sufficient understanding of the present application. The present application can be implemented in many other ways different from those described above, and those skilled in the art can make similar improvements without departing from the connotation of the present application. Therefore, the present application is not limited by the specific embodiments disclosed above. Moreover, the technical features of the above-mentioned embodiments can be combined arbitrarily. In order to make the description concise, not all possible combinations of the various technical features in the above-mentioned embodiments are described. However, as long as there is no contradiction in the combination of these technical features, it should be regarded as the scope of the specification.

The above-mentioned embodiments only express several implementation modes of the present application, and their description is relatively specific and detailed, but they should not be understood as a limitation to the scope of the present application. It should be noted that, for those of ordinary skill in the art, without departing from the concept of the present application, several modifications and improvements can be made, and these all fall within the protection scope of the present application. Therefore, the protection scope of the present application shall be subject to the appended claims.

What is claimed is:

1. A multicolored decorative sheet, comprising:
   a supporting layer; and
   a solid film layer, disposed on the supporting layer and presenting a variety of colors, the solid film layer comprising a plurality of layers stacked in a thickness direction and extending a length between one end to an opposing end in a planar direction,
   wherein at least two layers of the plurality of layers each comprises a variation in material and a variation in thickness, wherein the variation in material comprises multiple different materials in different regions across the length with different regions having different materials presenting different colors and the variation in thickness extending across the multiple different materials such that a corresponding color of each material at different thicknesses is further different,
   wherein the change in thickness of at least one of the at least two layers is a gradual change in thickness comprising at least one gradual thickening and/or gradual thinning across the length from the one end to the opposing end, presenting a gradual change in the corresponding colors, and
   wherein the multiple different materials in different regions across the length of each of the at least two layers comprises at least two regions with different materials comprising a first region with a first material comprising a first size and position along the length and a second region with a second material comprising a second size and second position along the length different from the first size and first position along the length, wherein the first size and first position along the length of the first region of the one of the at least two layers such that it is offset from and not overlapping the first region of another of the at least two layers in the thickness direction in a cross-sectional view and in the planar direction in a plan view.

2. The multicolored decorative sheet of claim 1, wherein the second size and second position along the length of the second region of the one of the at least two layers is such that it is offset from and partially overlapping the second region of the other of the at least two layers in the thickness direction in the cross-sectional view and in the planar direction in the plan view.

3. The multicolored decorative sheet of claim 1, wherein the gradual change in thickness comprising the at least one gradual thickening and/or gradual thinning across the length from the one end to the opposing end is one of the following: only the gradual thickening, only the gradual thinning, the gradual thickening followed by the gradual thinning, the gradual thinning followed by the gradual thickening, the gradual thickening followed by the gradual thinning which is then repeated again, the gradual thinning followed by the gradual thickening which is then repeated again.

4. The multicolored decorative sheet of claim 1, wherein the variation in thickness of the other of at least at least two layers is regularly changing, randomly changing, or also a gradual change in thickness comprising at least one gradual thickening and/or gradual thinning across the length from the one end to the opposing end.

5. The multicolored decorative sheet of claim 4, wherein the variation in thickness of the other of at least at least two layers is also the gradual change in thickness comprising the at least one gradual thickening and/or gradual thinning across the length from the one end to the opposing end,
   wherein the gradual changes in thickness of each of the at least two layers comprises the same gradual change across the length in the planar direction or different gradual changes across the length in the planar direction.

6. The multicolored decorative sheet of claim 5, wherein the gradual changes in thickness are different gradual changes in the thickness across the length in the planar direction, such that a thickest portion of the one of the at least two layers is offset from and not overlapping a thickest portion and at least partially overlapping a thinnest portion of the other of the at least two layers in the thickness direction in a cross-sectional view and in the planar direction in a plan view.

7. The multicolored decorative sheet of claim 5, wherein the variation in thickness of at least one or both of the at least two layers is/are changed across the length as to provide a curved surface or an undulating surface.

8. The multicolored decorative sheet of claim 5, wherein the multiple materials of the either or both of the at least two film layers further comprises a third region with the first material and the second material mixed comprising a third size and third position along the length between the first position and second position, wherein the third region comprises a transitional color, a mixed color, or a third different color,
   wherein the third size and third position along the length of the third region of the one of the at least two layers is such that it is entirely overlapping, offset from and partially overlapping, or offset from and not overlapping the third region of the other of the at least two layers in the thickness direction in a cross-sectional view and in the planar direction in a plan view.

9. The multicolored decorative sheet of claim 5, wherein the different colors result from a difference in color shade and/or difference in color type.

10. The multicolored decorative sheet of claim 5, wherein the supporting layer is transparent and colorless, translucent and colored, or opaque and comprises a polyethylene terephthalate (PET) layer, a polymethylmethacrylate (PMMA) layer, a polycarbonate (PC) layer, a polyimide (PI) layer, an organic glass layer, or a glass layer.

11. A cover plate for a consumer electronic product comprising the multicolored decorative sheet of claim 1.

12. A multicolored decorative sheet, comprising:
a supporting layer; and
a solid film layer, disposed on the supporting layer and presenting a variety of colors, the solid film layer comprising a plurality of layers stacked in a thickness direction and extending a length between one end to an opposing end in a planar direction,
wherein at least two layers of the plurality of layers each comprises a variation in material and a variation in thickness, wherein the variation in material comprises multiple different materials in different regions across the length with different regions having different materials presenting different colors and the variation in thickness extending across the multiple different materials such that a corresponding color of each material at different thicknesses is further different,
wherein the change in thickness of each of the at least two layers is a gradual change in thickness comprising at least one gradual thickening and/or gradual thinning across the length from the one end to the opposing end, presenting a gradual change in the corresponding colors,
wherein the gradual changes in thickness are different gradual changes in the thickness across the length in the planar direction, such that a thickest portion of one of the at least two layers is offset from and not overlapping a thickest portion of and at least partially overlapping a thinnest portion of another of the at least two layers in the thickness direction in a cross-sectional view and in the planar direction in a plan view, such that the thicknesses of the at least two layers, alone or in combination with additional layers, are complementary such that the solid film layer comprises a substantially uniform film thickness.

13. The multicolored decorative sheet of claim 12, wherein each gradual change in thickness comprising the at least one gradual thickening and/or gradual thinning across the length from the one end to the opposing end is one of the following: only the gradual thickening, only the gradual thinning, the gradual thickening followed by the gradual thinning, the gradual thinning followed by the gradual thickening, the gradual thickening followed by the gradual thinning which is then repeated again, the gradual thinning followed by the gradual thickening which is then repeated again.

14. The multicolored decorative sheet of claim 12, wherein the variation in thickness of at least one or both of the at least two layers is/are changed across the length as to provide a curved surface or an undulating surface.

15. The multicolored decorative sheet of claim 12, wherein the multiple different materials in different regions across the length of each of the at least two layers comprises at least two regions with different materials comprising a first region with a first material comprising a first size and position along the length and a second region with a second material comprising a second size and second position along the length different from the first size and first position along the length.

16. The multicolored decorative sheet of claim 15, wherein the first size and first position along the length of the first region of the one of the at least two layers such that it is offset from and not overlapping the first region of another of the at least two layers in the thickness direction in a cross-sectional view and in the planar direction in a plan view, and
wherein the second size and second position along the length of the second region of the one of the at least two layers is such that it is offset from and partially overlapping or offset from and not overlapping the second region of the other of the at least two layers in the thickness direction in a cross-sectional view and in the planar direction in a plan view.

17. The multicolored decorative sheet of claim 15, wherein the multiple materials of the either or both of the at least two film layers further comprises a third region the first material and the second material mixed comprising a third size and third position along the length between the first position and second position, wherein the third region comprises a transitional color, a mixed color, or a third different color, and
wherein the third size and third position along the length of the third region of the one of the at least two layers is such that it is entirely overlapping, offset from and partially overlapping, or offset from and not overlapping the third region of the other of the at least two layers in the thickness direction in a cross-sectional view and in the planar direction in a plan view.

18. The multicolored decorative sheet of claim 12, wherein the different colors result from a difference in color shade and/or difference in color type.

19. The multicolored decorative sheet of claim 12, wherein the supporting layer is transparent and colorless, translucent and colored, or opaque and comprises a polyethylene terephthalate (PET) layer, a polymethylmethacrylate (PMMA) layer, a polycarbonate (PC) layer, a polyimide (PI) layer, an organic glass layer, or a glass layer.

20. A cover plate for a consumer electronic product comprising the multicolored decorative sheet of claim 12.

* * * * *